United States Patent [19]

Takahashi et al.

[11] Patent Number: 5,164,667
[45] Date of Patent: Nov. 17, 1992

[54] VOLTAGE DETECTING DEVICE

[75] Inventors: Hironori Takahashi; Shinichiro Aoshima; Takuya Nakamura; Yutaka Tsuchiya, all of Shizuoka, Japan

[73] Assignee: Hamamatsu Photonics K. K., Shizuoka, Japan

[21] Appl. No.: 619,913

[22] Filed: Nov. 30, 1990

Related U.S. Application Data

[63] Continuation of Ser. No. 201,205, Jun. 2, 1988.

[30] Foreign Application Priority Data

Jun. 10, 1987 [JP] Japan .................. 62-144982

[51] Int. Cl.⁵ ............................................. G01R 31/28
[52] U.S. Cl. ................................... 324/158 R; 324/96
[58] Field of Search ................ 324/96, 117 R, 158 R; 350/356, 374, 376

[56] References Cited

U.S. PATENT DOCUMENTS 4,631,402 12/1986 Nagatsuma et al. ................. 324/96
4,683,421 7/1987 Miller et al. ......................... 324/96

OTHER PUBLICATIONS

Valdmanis et al. "Subpicosecond Electrooptic Sampling: Principles and Applications", IEEE Journal of Quantum Electronics, vol. QE-22, No. 1, Jan. 1986.

Primary Examiner—Ernest F. Karlsen
Attorney, Agent, or Firm—Finnegan, Henderson, Farabow, Garrett and Dunner

[57] ABSTRACT

A voltage detecting device using an electro-optical material with a refractive index which is changed by a voltage at a part of an object comprising a light source, comprises an electro-optical material for changing the optical path of the light beam from the light source in accordance with the refraction index of the electro-optical material and a slit or optical fiber extractor at a predetermined position at the output of the electro-optical material for extracting the quantity of light of the light beam at the predetermined position and a detector detecting a voltage at the part of the object from the quantity of light extracted.

1 Claim, 4 Drawing Sheets

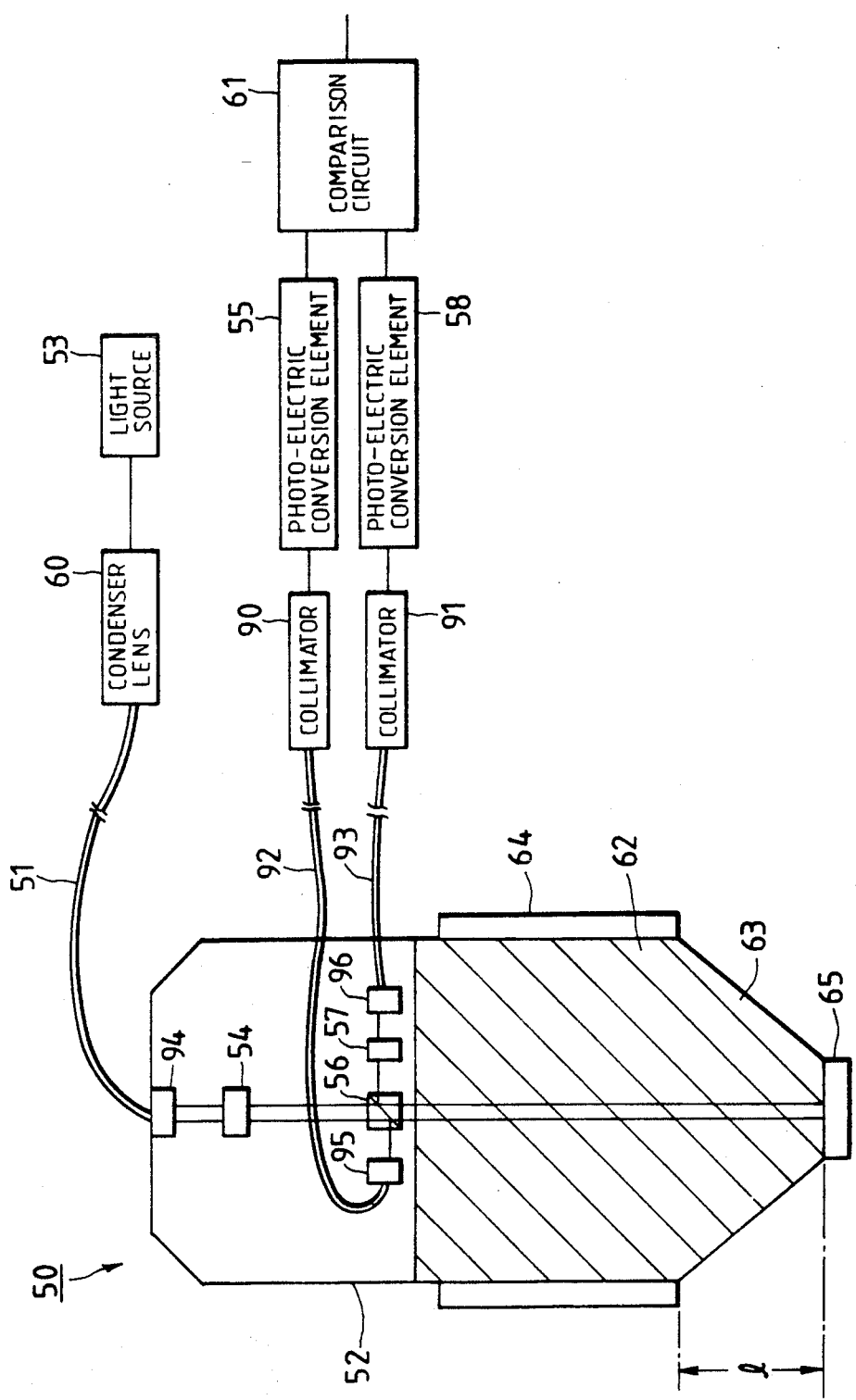

VOLTAGE DETECTING DEVICE

This is a continuation of application Ser. No. 07/201,205, filed Jun. 2, 1988.

BACKGROUND OF THE INVENTION

1. Field of the Invention

This invention relates to a voltage detecting device, such as an electrical circuit, for detecting the voltage of a predetermined part of an object under measurement, and more particularly to a voltage detecting device which operates upon the principle that the refractive index of an electro-optical material depends on the voltage of a predetermined part of an object under measurement.

2. Description of the Related Art

A variety of voltage detecting devices comprising electrical circuits have been used to detect the voltage of a predetermined part of an object. One example of a voltage detecting device employs a probe which is brought into contact with the predetermined part of the object to detect the voltage in the part of the object. In another example of a voltage detecting device, a probe is held away from the predetermined part of the object and an electron beam is applied to the predetermined part of the object to detect the voltage.

In the art of voltage detecting devices, there is a high demand for a method of detecting the voltage of a minute part of an object, such as a small integrated circuit, with high accuracy and without affecting the conditions of the minute part. A voltage detecting device of the type with a probe which is brought into contact with a predetermined part of an object under measurement has many disadvantages. It is difficult to bring the probe into contact with a small part of an integrated circuit. Even if it was possible to bring the probe into contact with a part of the integrated circuit, it is difficult to analyze the operation of the integrated circuit correctly based only upon the voltage data. Furthermore, the operating conditions of the integrated circuit are changed by bringing the probe into contact with the integrated circuit.

The voltage detecting device of the type employing an electron beam while a probe is held away from an object under measurement in order to detect a voltage also has many problems. The part to be measured must be exposed in a vacuum and may be damaged by the electron beam.

In the conventional voltage detecting devices, the operating speed of the detector cannot keep up with a high-speed change of voltage. Therefore, conventional voltage detecting devices have the disadvantage that voltages that rapidly change, in integrated circuits for instance, cannot be accurately detected.

In order to solve the above problems, a voltage detecting device operating upon the principle that the polarization of a light beam is changed by the voltage of a predetermined part of an object under measurement has been disclosed in unpublished Japanese patent application number 137317/87 filed in Japan on May 30, 1987. FIG. 7 is a diagram showing the arrangement of the Applicants' previously disclosed voltage detecting device.

As shown in FIG. 7, the voltage detecting device comprises an optical probe 52, a light source 53 including for instance a laser diode, an optical fiber 51 for guiding a light beam from the light source 53 through a condenser lens 60 to the optical probe 52, and an optical fiber 92 for leading a reference light beam from the optical probe 52 through a collimator 90 to a photo-electric conversion element 55. The device further comprises an optical fiber 93 for applying an emergent light beam from the optical probe 52 through a collimator 91 to a photo-electric conversion element 58, and a comparison circuit 61 in which the output electrical signals of the photo-electric conversion elements 55 and 58 are subjected to comparison.

Electro-optical material 62, such as an optically uniaxial crystal of lithium tantalate ($LiTaO_3$), is enclosed in the optical probe 52. The end portion 63 of the optical probe 52 is in the form of a circular truncated cone. A conductive electrode 64 is formed on the cylindrical wall of the optical probe 52. A reflecting mirror 65 made of a metal film or dielectric multilayer film is provided on the end face of the end portion 63 of the optical probe 52.

Provided inside the optical probe 52 are a collimator 94, condenser lenses 95 and 96, a polarizer 54 for extracting only a light beam having a predetermined polarization component out of a light beam outputted by the collimator 94, and a beam splitter 56 for dividing the light beam having the predetermined polarization component, which is provided by the polarizer 54, into the reference light beam and an incident light beam, and applying an emergent light beam from the electro-optical material 62 to an analyzer 57. The reference light beam and the emergent light beam are applied through the condenser lenses 95 and 96 to the optical fibers 92 and 93, respectively.

In a voltage detection device 50, as described above, the conductive electrode 64 formed on the cylindrical wall of the optical probe 52 is grounded. The end portion 63 of the optical probe 52 is set close to an object under measurement, such as an integrated circuit (not shown). As a result, the refractive index of the end portion 63 of the electro-optical material 62 in the optical probe 52 is changed. more specifically, in an optically uniaxial crystal, the difference between the refractive index of an ordinary light beam and that of an extraordinary light beam in the plane perpendicular to the direction of popagation is changed.

The output light beam of the light source 53 is applied through the condenser lens 60, the optical fiber 51, and the collimator 94 in the optical probe 52 to the polarizer 54. The polarizer 54 outputs a light beam having the predetermined polarization component of intensity I. The output light beam of the polarizer 54 is applied through the beam splitter 56 to the electro-optical material 62 in the optical probe 52. The reference light beam and the incident light beam formed by the beam splitter 56 are of intensity I/2. As was described above, the refractive index of the electro-optical material 62 is changed by the voltage of an object under measurement. Therefore, the incident light beam applied to the electro-optical material 62 is changed in polarization at the end portion 63 depending on the change of the refractive index and is then reflected by the reflecting mirror 65. The reflected light is applied, as the emergent light beam from the electro-optical material 62, to the beam splitter 56. The polarization of the incident light beam is changed in proportion to the difference in refractive index between an ordinary light beam and an extraordinary light beam which attributed to voltage, and in proportion to a value 2 l where l is the length of the end portion 63 of the electro-optical material 62.

The emergent light beam is applied to the analyzer 57 by the beam splitter 56. The intensity of the emergent light beam applied to the analyzer 57 is reduced to I/4 by the beam splitter 56. If the analyzer 57 is designed to transmit only a light beam having a polarization component perpendicular to the polarization component of the polarizer 54, then the analyzer changes the intensity I/4 of the emergent light beam applied to it to $(I/4) \sin^2(\pi/2) \cdot V/V_O)$ where V is the voltage of the object under measurement, and $V_O$ is the half-wavelength voltage. The emergent light beam is then applied to the photo-electric conversion element 58.

In the comparison circuit 61, the intensity I/2 of the reference light beam subjected to photo-electric conversion by the photo-electric conversion element 55 is compared with the intensity $(I/4) \sin^2((\pi/2) \cdot V/V_O)$ of the emergent light beam subjected to photo-electric conversion by the photo-electric conversion element 58.

The intensity $(I/4) \sin^2((\pi/2) \cdot V/V_O)$ of the emergent light beam depends on the change in refractive index of the end portion 63. of the electro-optical material 62 which is due to a variation in voltage. Therefore, the voltage at a predetermined part of an object under measurement, such as an integrated circuit, can be detected from the intensity.

As was described above, the voltage detecting device of FIG. 7 is designed so that the voltage of a predetermined part of an object under measurement is detected from the change in refractive index of the end portion 63 of the electro-optical material 62 which is caused when the end portion 63 of the optical probe 52 approaches the object. Therefore, with the device of FIG. 7 the voltage of a minute part of an integrated circuit which is difficult for a probe to contact can be detected with the optical probe 52 held away from the minute part. Further, the voltage of a minute part of an integrated circuit which is affected when the integrated circuit is contacted with a probe can be detected with the optical probe 52 held away from the minute part. Furthermore, a pulse light source such as a laser diode outputting an optical pulse which is extremely short in pulse width may be employed to sample the rapid voltage changes of the object at considerably short time intervals. Alternatively, a d-c light source and a high-speed response detector such as a streak camera may be used to measure the quick voltage changes of the object with high resolution. Thus, the rapid voltage changes can be detected with high accuracy using the device of FIG. 7.

The voltage detecting device 50 of FIG. 7, however, has many difficulties. The FIG. 7 device detects the voltage of a predetermined part of an object under measurement from the variation in polarization of the light beam in the electro-optical material 62. Therefore, it is necessary to extract only the light beam having the predetermined polarization component from the output light beam of the light source 53 with the aid of the polarizer 54. It is further necessary to extract the predetermined linear polarization component from the emergent light beam from the electro-optical material 62 with the aid of the analyzer 57. Accordingly, the device has low utilization of light. Furthermore, the device includes the beam splitter 56. Therefore, the intensity of the emergent light beam applied to the analyzer 57 is lower than that of the light beam output from the light source 53. As a result, the voltage detection is of limited accuracy and efficiency. Moreover, the device has a relatively large number of optical components including the polarizer 54, the analyzer 57 and the beam splitter 56. Therefore, accuracy of the optical system is limited. In addition, by detecting the voltage of a predetermined part of an object under measurement from the change in polarization, only the absolute value of voltage can be detected. It is impossible to determine the polarity of the voltage, i.e., it is impossible to determine whether the voltage is positive or negative.

SUMMARY OF THE INVENTION

An object of the present invention is to provide a voltage detecting device in which the need to extract predetermined polarization components from light beams is eliminated.

Another object of the present invention is to provide a voltage detecting device which has high utilization of light.

Another object of the present invention is to provide a voltage detecting device which efficiently directs light along light paths.

Another object of the present invention is to provide a voltage detecting device in which beam splitters and associated inaccuracies and inefficiencies are omitted.

A further object of the present invention is to provide a voltage detecting device which employs a simple optical system.

A further object of the present invention is to provide a voltage detecting device which detects the polarity as well as magnitude of the voltage to be detected.

A still further object of the present invention is to provide a voltage detecting device which can directly detect with high accuracy the voltage, as well as polarity of voltage, of a predetermined part of an object under measurement using a simple optical system.

The foregoing objects of the invention have been achieved by the voltage detecting device according to the invention comprising a light source for outputting a light beam; optical path changing means made of electro-optical material for causing the light beam from the light source to advance along an optical path corresponding to a refractive index of the electro-optical material; light quantity extracting means provided at a predetermined position on the output side of the optical path changing means, for extracting the quantity of light of the light beam at the predetermined position; and detecting means for detecting a voltage at a predetermined part of an object under measurement from the quantity of light extracted by the light quantity extracting means.

BRIEF DESCRIPTION OF THE DRAWINGS

The manner by which the above and other objects are attained will be fully apparent from the following detailed description when considered with the drawings, wherein:

FIG. 7 is a diagram showing the arrangement of a voltage detecting device previously disclosed by Applicants.

DETAILED DESCRIPTION OF THE PREFERRED EMBODIMENTS

In the voltage detecting device of the invention, the light beam output by the light source is applied to an optical path changing means, such as a triangular prism, of electro-optical material. The light beam applied to the optical path changing means advances along the optical path which is determined by the refractive index of the optical path changing means, and emerges as a transmitted light beam or reflected light beam, from the optical path changing means. The refractive index of the optical path changing means depends on the voltage of the predetermined part of the object under measurement, and accordingly, the optical path of the transmitted light beam or reflected light beam also depends on the voltage of the predetermined part of the object under measurement.

Since the light beam from the light source has a spatial intensity distribution, the transmitted light beam, or reflected light beam, emerging out of the optical path changing means also has a spatial intensity distribution. A light quantity extracting means, such as a slit or aperture, is provided at a predetermined position on the output side of the optical path changing means. The quantity of light of the transmitted light beam, or reflected light beam passing through the slit or aperture is changed with the movement of the spatial intensity distribution which is caused by the change of the optical path of the transmitted light beam or reflected light beam. The change in the quantity of light is detected by the detecting means, such as a photo-electric conversion element, and the voltage of the predetermined part of the object is detected from the output of the photo-electric conversion element.

Figure 1:
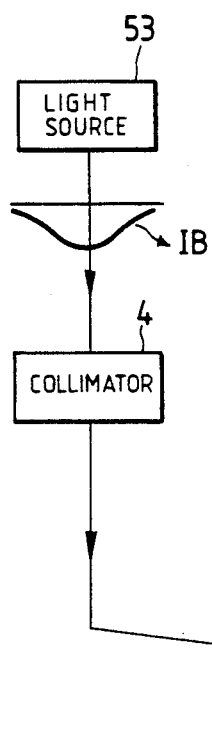
FIG. 1 is a diagram showing the arrangement of the first embodiment of a voltage detecting device according to the present invention.
Figure 1:
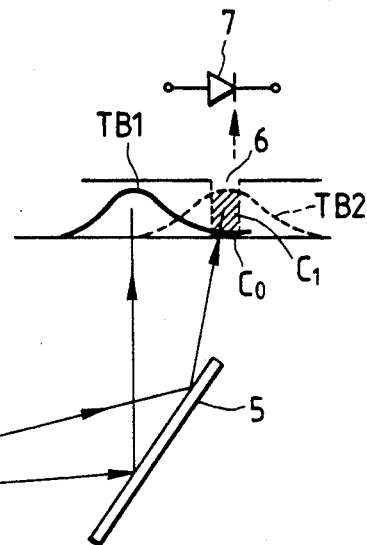

FIG. 1 is a diagram showing the arrangement of the first embodiment of a voltage detecting device according to the present invention. The voltage detecting device, as shown in FIG. 1, comprises a triangular prism 1 made, for instance, of optically uniaxial crystal lithium tantalate ($LiTaO_3$). The voltage detecting device is different from a device which measures voltage according to the change in polarization of a light beam.

In operation, the end 2 of the prism 1 is set close to an object under measurement, so that the refractive index of the prism 1 is changed by the voltage of a predetermined part of the object. An incident light beam IB is applied to the prism 1 through a collimator 4 by a light source 53 such as a laser. The incident light beam thus applied advances along the optical path in the prism 1 which is determined by the refractive index of the prism 1, and emerges as a transmitted light beam from the prism. The transmitted light beam, after being reflected at a predetermined angle by a mirror 5, is applied through a slit 6 to a detector, for example, a photo-electric conversion element 7.

If no voltage is applied to the prism 1, the incident light beam IB applied to the prism 1 advances along an optical path T1 in the prism 1, and emerges from the prism as a transmitted light beam TB1. On the other hand, if the voltage, for instance a positive voltage, of a predetermined part of an object is applied to the prism 1, the refractive index of the triangular prism 1 of electro-optical material is changed. Consequently, the incident light beam IB output by the light source 53 advances along an optical path T2 in the prism, and emerges from the prism as a light beam TB2.

Since the incident light beam IB from the light source 53 has a spatial intensity distribution, the transmitted light beams TB1 and TB2 reach the slit 6 with spatial intensity distributions. If the slit 6 is set in the optical path of the transmitted light beam TB2 which has advanced along the optical path T2 in the triangular prism 1, then the transmitted light beam TB1 which has advanced along the optical path T1 in the triangular prism 1, can scarcely pass through the slit 6. More specifically only a small quantity of light $C_O$ from the spatial intensity distribution of light beam TB1 passes through the slit 6, as shown in FIG. 1. The transmitted light beam TB2 which has advanced along the optical path T2 in the triangular prism 1 substantially passes through the slit. More specifically, the greatest part of the optical intensity distribution of the transmitted light beam TB2 passes through the slit 6. In other words, large quantity of light $C_1$ as shown in FIG. 1 passes through the slit 6.

If the voltage of a predetermined part of the object under measurement changes, for example due to a pulse in the positive direction, when the voltage is initially zero the quantity of light passing through the slit 6 is extremely small, i.e. $C_O$. As a positive voltage is applied to the triangular prism 1, the quantity of light passing through the slit 6 is gradually increased, i.e. to $C_1$. When the voltage reaches zero again, the quantity of light passing through the slit 6 is decreased again, i.e. to $C_O$. The quantity of light passing through the slit 6 which changes with time is converted into an electrical signal by the photo-electric conversion element 7, so that the waveform of the voltage of the predetermined part of the object can be observed.

Figure 2:
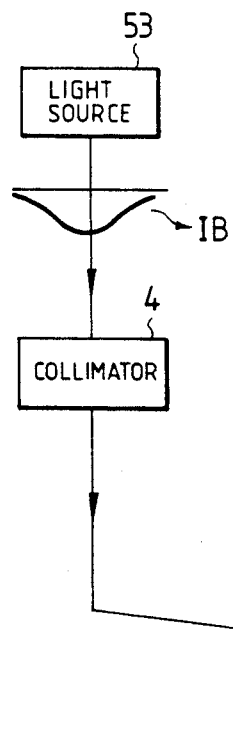
FIG. 2 is a diagram showing the arrangement of the second embodiment of a voltage detecting device according to the invention which can detect a negative voltage as well as a positive voltage.
Figure 2:
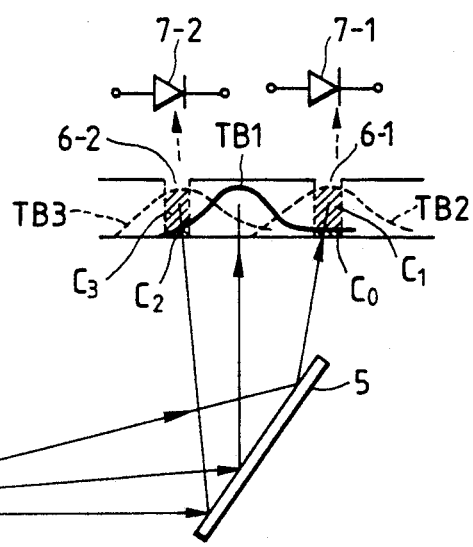

In the embodiment of the voltage detecting device described above with reference to FIG. 1, one slit 6 is provided for the detection of positive voltages. However, sometimes it is required to detect negative voltages. FIG. 2 is a diagram showing the arrangement of a second embodiment of the voltage detecting device of the present invention which can detect negative voltages as well as positive voltages. In the voltage detecting device of FIG. 2, a slit 6-1 is provided in the optical path of the transmitted light beam TB2 which emerges from the triangular prism 1 when a positive voltage is applied. Slit 6-1 is similar to the slit of the device of FIG. 1. A photo-electric conversion element 7-1 detects the quantity of light passing through the slit 6-1 to detect positive voltages. A slit 6-2 and a photo-electric conversion element 7-2 are provided for detection of negative voltages. When a negative voltage is applied to the triangular prism 1, the light beam IB from the light source 53 advances along an optical path T3 in the triangular prism 1 and emerges as a transmitted light beam TB3 from the prism. A slit 6-2 is provided in the optical path of the transmitted light beam TB3 so that, in a manner similar to the detection of a positive voltage, the photo-electric conversion element 7-2 detects quantities of light $C_2$ and $C_3$ passing through the slit 6-2 to detect a negative voltage.

Figure 3:
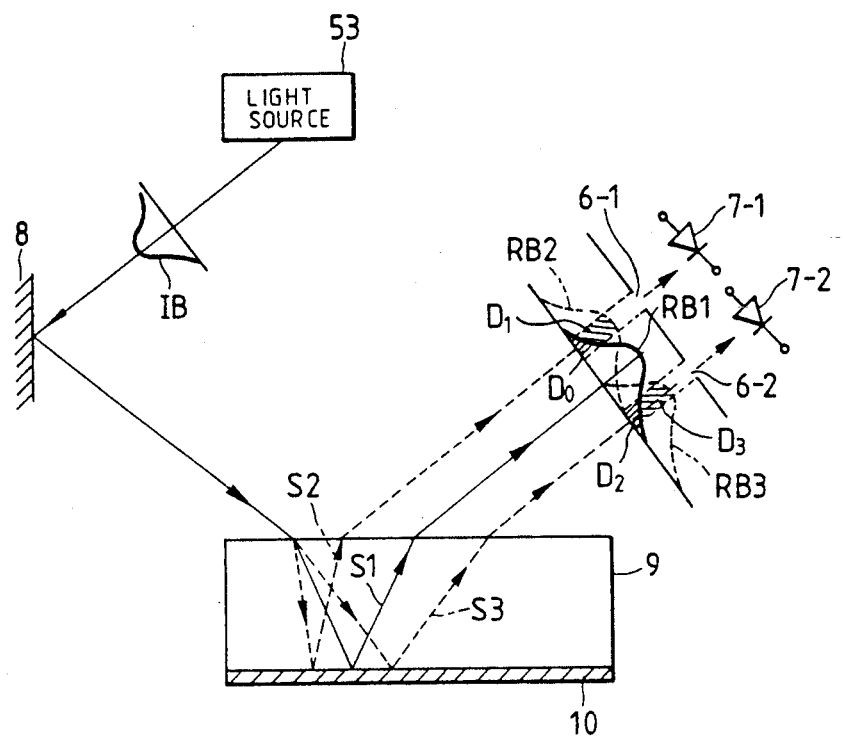
FIG. 3 is a diagram showing one modification of the voltage detecting device shown in FIG. 2.

FIG. 3 shows one modification of the voltage detecting device shown in FIG. 2. In the device of FIG. 3, the incident light beam IB from the light source 53 is applied via a mirror 8 to an electro-optical material 9 of an optical crystal having a reflecting mirror 10 made of a metal film or dielectric multilayer film. The incident light beam emerges as an emergent light beam from the electro-optical material 9. The emergent light beam is applied through a slit to a photo-electric conversion element.

If no voltage is applied to the electro-optical material 9, the incident light beam IB advances along an optical path S1 in the electro-optical material 9, and emerges as an emergent light beam RB1, from the material. If a positive voltage of the object under measurement is applied to the electro-optical material 9, the refractive index of the material is changed and the incident light beam IB advances along an optical path S2 in the electro-optical material 9, and emerges as an emergent light beam RB2. As in the case of the voltage detecting device shown in FIG. 2, the slit 6-1 is set in the optical path of the emergent light beam RB2. Therefore, when the voltage of the predetermined part of the object is zero, only a small part ($D_O$) of the quantity of light of the emergent light beam RB1 passes through the slit 6-1; and when the voltage of the predetermined part of the object has a positive value, the quantity of light $D_1$ of the emergent light beam RB2 passes through the slit 6-1. Therefore, by converting the quantities of light passing through the slit 6-1 into electrical signals with the photo-electric conversion element 7-1, the positive voltage of the predetermined part of the object can be detected.

If on the other hand, a negative voltage is applied to the electro-optical material 9, the incident light beam IB advances along an optical path S3 in the material 9, and emerges as an emergent light beam RB3. The slit 6-2 is set in the optical path of the emergent light beam RB3. In a manner similar to the detection of a positive voltage, the negative voltage is detected from the quantities of light $D_2$ and $D_3$.

Figure 4:
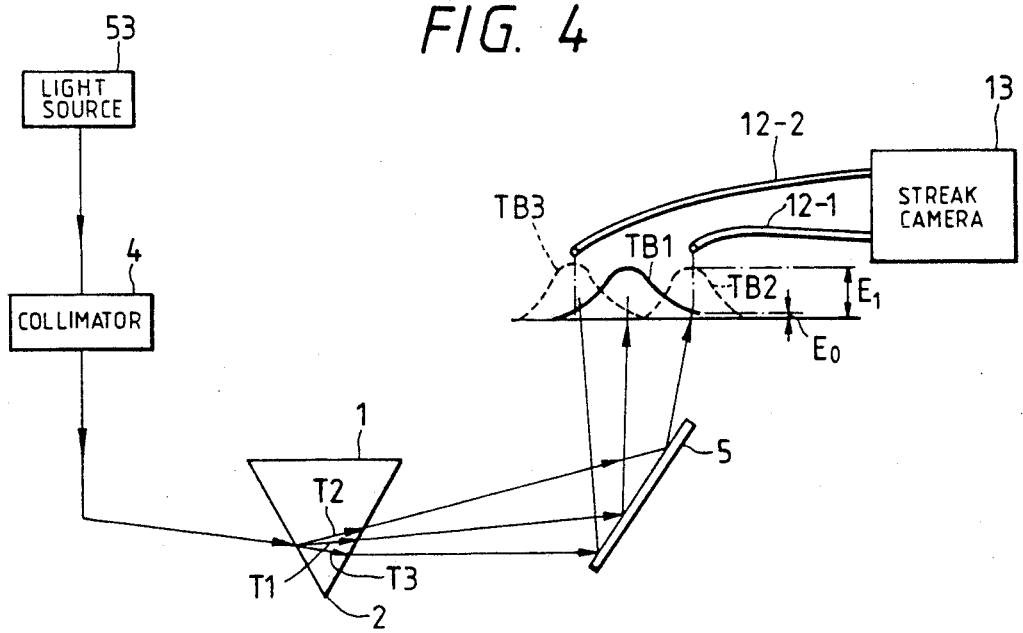
FIG. 4 is a diagram showing the voltage detecting device of FIG. 2 equipped with a streak camera.

FIG. 4 is a diagram showing the arrangement of the voltage detecting device as in FIG. 2 and equipped with a streak camera according to the present invention. In FIG. 4, components functionally corresponding to components which have been described with reference to FIGS. 1 and 2 are designated by the same reference numerals or characters.

In the voltage detecting device as shown in FIG. 4, optical fibers 12-1 and 12-2 are employed instead of the slits 6-1 and 6-2, respectively, of the voltage detecting device in FIG. 2. The transmitted light beams are applied through the optical fibers 12-1 and 12-2 to a streak camera 13.

Figure 5:
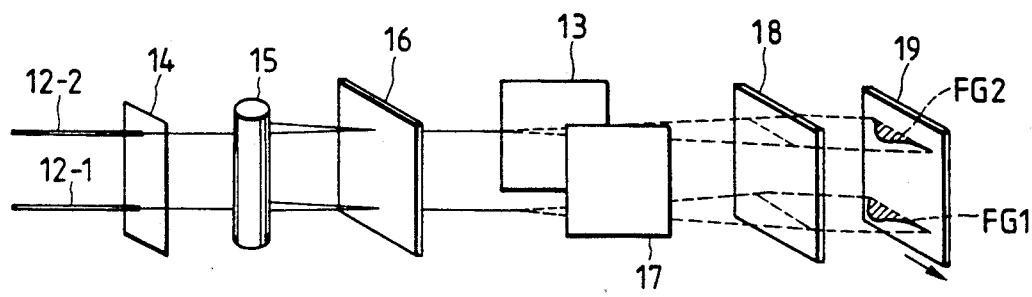
FIG. 5 is a diagram showing the arrangement of a streak camera.

The streak camera 13, as shown in FIG. 5, comprises a slit 14 in which the optical fibers 12-1 and 12-2 are juxtaposed; a lens 15 to which the transmitted light beams emerging from the optical fibers 12-1 and 12-2 are applied through the slit 14; a photo-electric surface 16 on which the transmitted light beams are focused by the lens 15; a pair of deflecting electrodes 17 for laterally deflecting the electron beams which are formed through photo-electric conversion by the photo-electric surface 16; a micro-channel plate 18 for multiplication of the electron beams deflected; and a fluorescent surface 19 to which the electron beams from the micro-channel plate 18 are applied. In FIG. 5, the micro-channel plate 18 and the fluorescent surface 19 are shown separated from each other; however, in practice, they may be joined together. Furthermore, in FIG. 5, the lens 15 is illustrated as cylindrical; however, in practice, it need not be cylindrical. In the streak camera 13 a saw tooth voltage is applied to the deflecting electrodes 17 in a time division manner to sweep the fluorescent surface 19 horizontally with the photoelectron beams which are formed according to the signal light beams applied to the photo-electric surface 16. As a result, the variation in voltage of the predetermined part of the object can be detected as a one-dimensional optical intensity distribution on the fluorescent surface 19.

The voltage of the predetermined part of the object under measurement may be changed, for example due to a pulse in the positive direction. If the voltage is zero, the light beam from the light source advances along an optical path T1 in the triangular prism 1, and emerges as a transmitted light beam TB1. Therefore, the quantity of light, $E_O$, from the transmitted light beam TB1, and introduced through the optical fiber 12-1 to the streak camera is very small. If a positive voltage is applied to the triangular prism 1, the light beam applied to the prism 1 advances along an optical path T2 in the prism 1, and emerges as a transmitted light beam TB2. Therefore, the quantity of light, $E_1$, from the transmitted light beam TB2 and applied through the optical fiber 12-1 to the streak camera is large. If the voltage becomes zero again, the quantity of light from the transmitted light beam and introduced through the optical fiber 12-1 to the camera is decreased Thus, a one-dimensional optical intensity distribution FG1 correlated with the voltage pulse is detected on the fluorescent surface 19 of the streak camera 13.

If on the other hand, the voltage of the predetermined part of the object is changed, for example due to a pulse in the negative direction, the quantity of light from the transmitted light beam and introduced through the optical fiber 12-2 to the streak camera 13 is changed, so that a one-dimensional optical intensity distribution FG2 correlated with the voltage pulse is detected on the fluorescent surface 19 of the streak camera 13.

Thus, in the voltage detecting device of FIG. 4, a one-dimensional optical intensity distribution corresponding to a voltage variation can be obtained on the fluorescent surface 19 of the streak camera 13 by using the optical fibers 12-1 and 12-2 and the streak camera 13.

Figure 6:
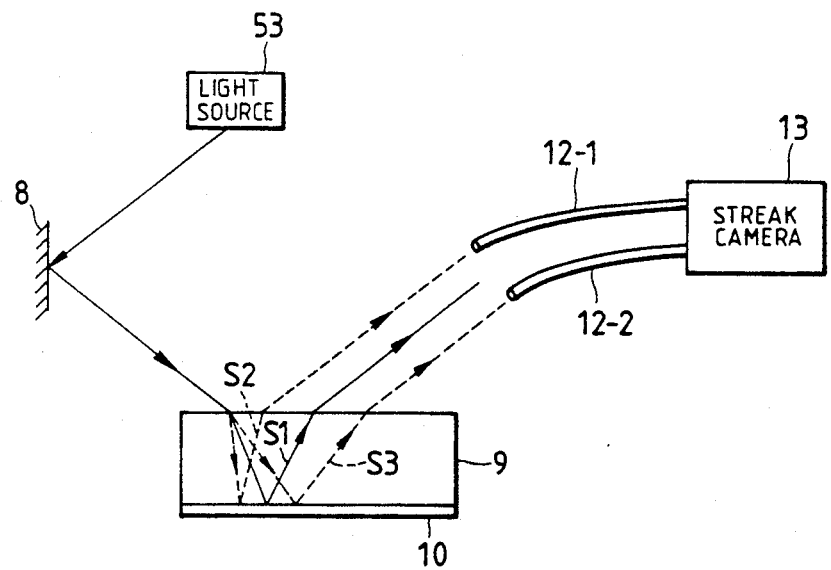
FIG. 6 is a diagram showing the voltage detecting device of FIG. 3 equipped with a streak camera.

FIG. 6 shows a modification of the voltage detecting device of FIG. 4. In the device of FIG. 6, instead of a triangular prism 1 as shown in FIG. 4, an electro-optical material 9 with a reflecting mirror 10, which is substantially the same as that in FIG. 3, is employed. In the modification, the emergent light beams from the electro-optical material 9 are applied through the optical fibers 12-1 and 12-2 to the streak camera 13 so that, as in the case of the voltage detecting device in FIG. 4, a one-dimensional optical intensity distribution corresponding to the voltage variation of the predetermined part of the object under measurement is obtained on the fluorescent surface of the streak camera 13.

In the embodiments of the present invention, the detection of voltage is not based on the change in polarization of a light beam. That is, the embodiments utilize the principles that a light beam has a spatial intensity distribution, and that the optical path of a light beam in an electro-optical material is changed with the refractive index of the electro-optical material, to detect, from the quantities of light provided through slits or optical fibers disposed at predetermined positions, the voltage of a predetermined part of an object under measurement.

Thus, in the invention, it is unnecessary to extract from the light beam output by the light source, only the light beam having a predetermined polarization component. Therefore, the light beam from the light source is applied to the optical fibers without reducing light intensity. Furthermore, the voltage is accurately detected with the photo-electric conversion elements or with the streak camera.

In the embodiments of the invention, it is unnecessary to use the polarizer, the analyzer and the beam splitter found in other voltage detecting devices. That is, the voltage detecting device of the invention is simple in construction, comprising a triangular prism of electro-optical material or electro-optical material, such as material 9, and a slit or an optical fiber. Therefore, in the device of the present invention, the optical system is maintained high in precision, and the voltage of the object can be detected with high accuracy at all times. Furthermore, employing the two slits or the two optical fibers makes it possible to detect not only the magnitude of the voltage but also its polarity.

In each of the embodiments of the present invention, the optical system may be provided inside an optical probe. In this case, the inner wall of the optical probe, except for the portions which a light beam passes through, should be painted black, so as to prevent the scattering of light.

If the voltage of an object under measurement changes periodically, a pulse light source may be employed so that the voltage is measured as indicated in FIGS. 1 through 3 by sampling. If it is necessary to measure the asynchronous voltage of an object with high resolution, a high-speed response detector, such as a streak camera as shown in FIGS. 4 through 6, should be used.

In the voltage detecting device of the present invention, the light beam from the light source advances along the optical path corresponding to the refractive index by the optical path changing means. The quantity of light at a predetermined position on the output side of the optical path changing means is extracted by the light quantity extracting means, and the voltage of a predetermined part of an object under measurement is detected from the quantity of light detected. Therefore, the voltage detecting device, which is simple in construction, detects the voltage. Furthermore, since the light beam from the light source is applied to the light quantity extracting means with its intensity unchanged, the voltage is detected with high accuracy.

What is claimed is:

1. A voltage detecting device using an electro-optical material whose refractive index is changed by a voltage at a predetermined part of an object under measurement, said voltage detecting device comprising:

a light source for outputting a light beam;

optical path changing means made of said electro-optical material, for causing said light beam from said light source to advance along an optical path, wherein said optical path changes according to said refractive index of aid electro-optical material that is changed by said voltage at said predetermined part of said object under measurement;

light quantity extracting means provided at a predetermined position on an output side of said optical path changing means, for extracting the quantity of light of said light beam at said predetermined position, wherein said light quantity extracting means comprises two optical fibers, such that one of said two optical fibers is provided on the optical path of a light beam which emerges from said optical path changing means when a positive voltage is applied to said optical path changing means, and the other of said two optical fibers is provided on the optical path of a light beam which emerges from said optical path changing means when a negative voltage is applied to said optical path changing means; and detecting means for detecting said voltage at said predetermined part of said object under measurement from said quantity of light extracted by said light quantity extracting means.

* * * * *

UNITED STATES PATENT AND TRADEMARK OFFICE
CERTIFICATE OF CORRECTION

PATENT NO. : 5,164,667

DATED : November 17, 1992

INVENTOR(S) : Hironori Takahashi et al.

It is certified that error appears in the above-identified patent and that said Letters Patent is hereby corrected as shown below:

Claim 1, Column 10, Line 18, change "aid" to --said--.

Signed and Sealed this

Fourteenth Day of December, 1993

Attest:

BRUCE LEHMAN

Attesting Officer

Commissioner of Patents and Trademarks